United States Patent [19]
Ueda et al.

[11] Patent Number: 6,103,600
[45] Date of Patent: Aug. 15, 2000

[54] METHOD FOR FORMING ULTRAFINE PARTICLES AND/OR ULTRAFINE WIRE, AND SEMICONDUCTOR DEVICE USING ULTRAFINE PARTICLES AND/OR ULTRAFINE WIRE FORMED BY THE FORMING METHOD

[75] Inventors: Tohru Ueda, Fukuyama; Yasumori Fukushima, Sakurai; Kenta Nakamura, Fukuyama, all of Japan

[73] Assignee: Sharp Kabushiki Kaisha, Osaka, Japan

[21] Appl. No.: 09/159,645

[22] Filed: Sep. 24, 1998

[30] Foreign Application Priority Data

Sep. 24, 1997 [JP] Japan ................................ 9-258921

[51] Int. Cl.$^7$ .......................... H01L 21/00; H01L 21/31; H01L 21/469; H01L 21/84
[52] U.S. Cl. .......................... 438/503; 438/507; 438/962; 438/149; 438/22; 257/9; 257/213
[58] Field of Search .............................. 438/46, 149, 151, 438/161, 300, 507, 962, 503; 257/9, 213, 255, 288; 372/43, 44; 117/87, 92, 93

[56] References Cited

U.S. PATENT DOCUMENTS 5,013,683  5/1991  Petroff et al. .
5,296,719  3/1994  Hirai et al. .

FOREIGN PATENT DOCUMENTS 8-64525  3/1996  Japan .

OTHER PUBLICATIONS

"Generation of a Aluminum Cluster Coated with y–Alumina" by Goto et al., contained in a collection of drafts for lectures made at " Ohyo Butsuri Gakkai"(the Japanese Applied Physics Society) meeting for spring 1997, Lecture No. 28a–T–3, Lecture Collection p–1313.

"Uniform Si Quantum Wires Fabricated by Anisotropic Etching of SIMOX Substrates" by Ishikuro et al., contained in a collection of drafts for lectures made at "Ohyo Butsuri Gakkai" (the Japanese Applied Physics society) meeting for spring 1996, Lecture No. 28a–PB–5, Lecture Collection p–798.

"Room Temperature obserbasion of Coulomb Blockade Oscillations in a Si Quantum Wire MOSFEET Fabricated by Anisotropic Etching" by Ishikuro et al., contained in a collection of drafts for lectures Made at "Ohyo Butsuri Gakkai" (the Japanese Applied Physics Society) Meeting for spring 1996, Lecture No. 26p–ZA–12, Lecture Collection p–64.

"AFM Fabrication of Al–Wire" by Sakurai et al, contained in a collection of drafts for lectures made at "Ohyo Butsuri Gakkai" (the Japaneses Applied Physics Society) meeting for spring 1997, Lecture No. 30a–PB–4, Lecture Collection p–515.

Primary Examiner—Charles Bowers
Assistant Examiner—K. Christianson
Attorney, Agent, or Firm—Nixon & Vanderhye, P.C.

[57] ABSTRACT

A quantum dot and quantum fine wire forming method is provided which can allow control of the position for crystalline particle growth and enables formation of particles with high uniformity in size and density and with high reproducibility. After an Si substrate is formed with a step by a dry etching method, an SiO$_2$ film is formed on the surface of the substrate. The interior of a reaction chamber is evacuated to a vacuum of 10$^{-8}$ Torr, and then an Si$_2$H$_6$ gas is introduced into the reaction chamber to flow therein so that Si crystal particles (quantum dots) are formed along the step. The step is formed by conventional photolithography and dry etching; therefore, the position for quantum dot growth can be easily controlled. By controlling the rate and time period of gas flow and the temperature of the substrate it is possible to form quantum fine wires, and to control the size of quantum dots and/or thickness of quantum fine wires. In this way, high uniformity in quantum dot and/or quantum fine wire size/thickness and density can be realized with high reproducibility. Further, low cost production, high yield, and high productivity can be achieved without use of any special fine processing technique.

15 Claims, 13 Drawing Sheets

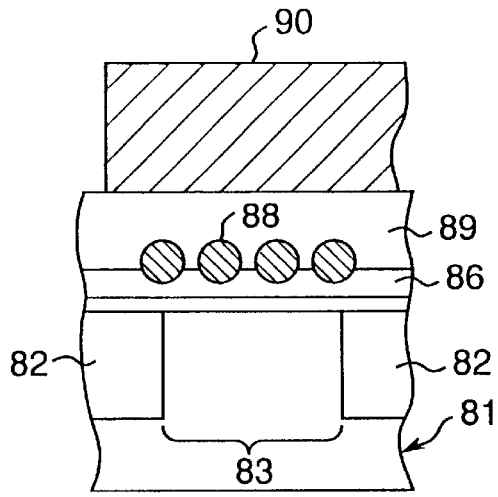
Fig.8A
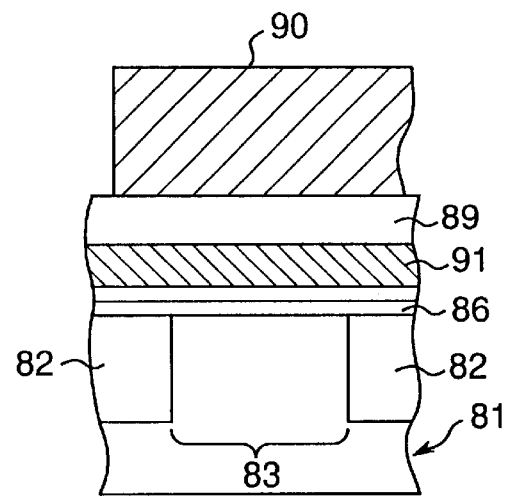
Fig.8B
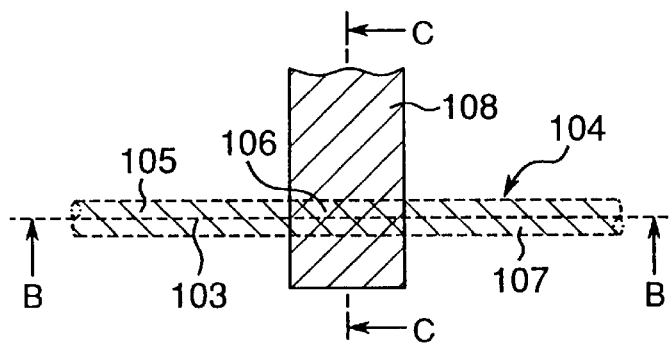
Fig.9A
Fig.9B
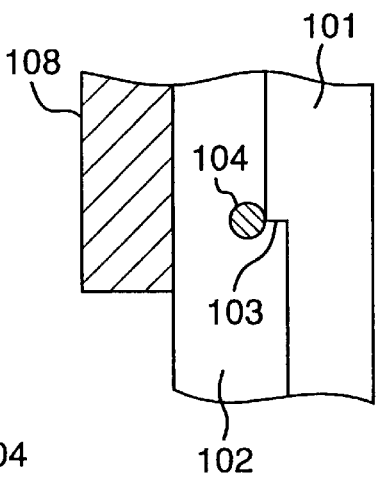
Fig.9C

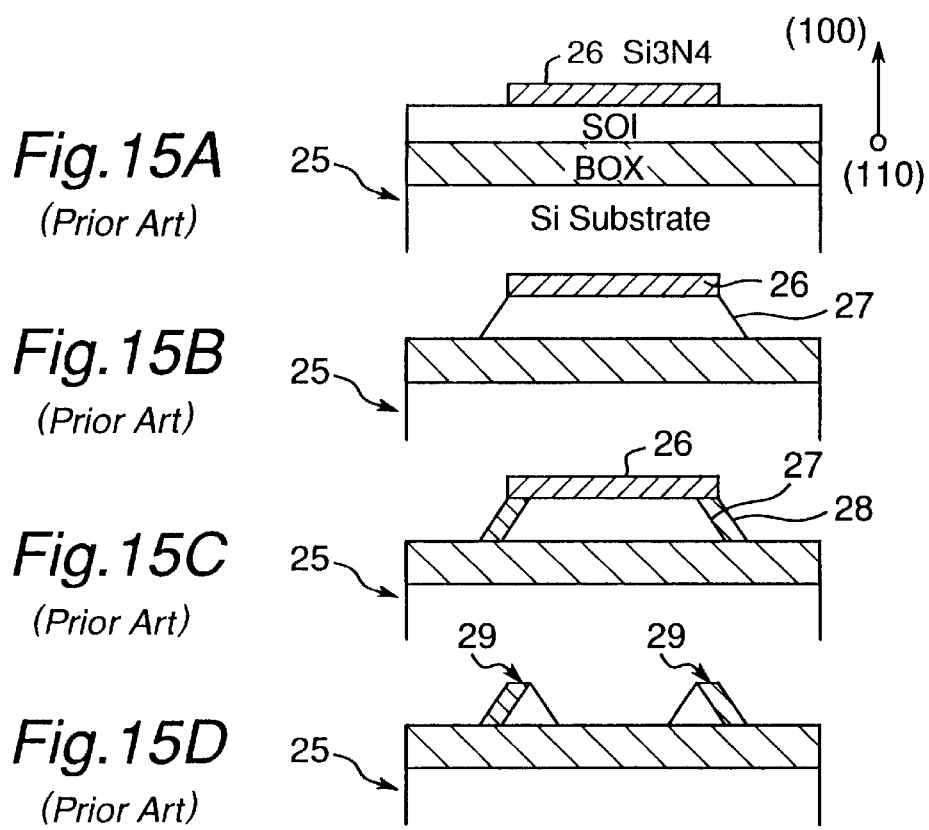
*Fig. 15A* (Prior Art)
*Fig. 15B* (Prior Art)
*Fig. 15C* (Prior Art)
*Fig. 15D* (Prior Art)
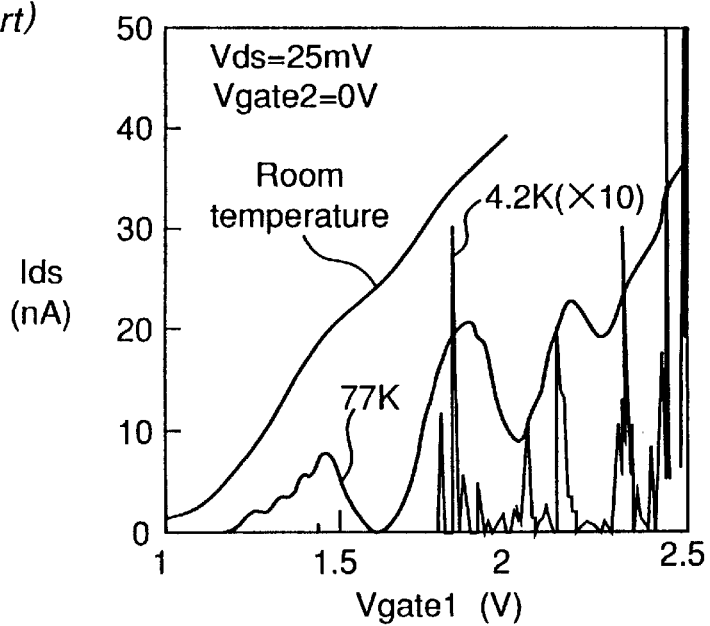
*Fig. 16* (Prior Art)

METHOD FOR FORMING ULTRAFINE PARTICLES AND/OR ULTRAFINE WIRE, AND SEMICONDUCTOR DEVICE USING ULTRAFINE PARTICLES AND/OR ULTRAFINE WIRE FORMED BY THE FORMING METHOD

BACKGROUND OF THE INVENTION

The present invention relates to an ultrafine particle and ultrafine wire forming method for forming on an insulative substrate semiconductor or metallic ultrafine particles and metallic ultrafine wire having such minute electric conductivity as is just enough to develop a quantum size effect, and to a semiconductor device using such ultrafine particles and/or ultrafine wire formed by the method.

In recent years, large-scale integrated circuit (LSI) technology which has supported the progress of electronics as a basic industrial segment has brought about striking improvements to semiconductor devices through miniaturization, the improvements including larger capacity, higher speed, and lower power consumption. On the basis of the operating principle of the prior art device, however, it is believed that when the size of the device is reduced to 0.1 $\mu$m or less, the threshold limit is already reached. Therefore, research activities have been actively made for development of a new device based on a new operating principle.

Above mentioned "new device" means a device having an ultrafine structure, such as an ultrafine particle of nanometer size (hereinafter referred to as quantum dot) and/or an ultrafine wire (hereinafter referred to as quantum fine wire). With respect to quantum dots, research activities have been briskly made for application of such dots to various one-electron devices utilizing Coulomb blockade phenomenon in particular as well as for application to a variety of quantum effect devices. With respect to quantum fine wires, it is expected that application of such a wire to ultrahigh speed transistors utilizing quantum effect could be achieved.

Whilst, as a new move directed toward future development of electronics technology, attempts have been made to employ an electronic circuit and an optical communication circuit on an integrated basis. For this purpose, a photoelectric conversion device loaded on the LSI board is indispensable, and such a device, formed from an Si (silicon) series material as the main current of LSI, has been already put in practical use. Regarding the matter of light emission, since a semiconductor of Si series, IV group has an indirect transition type band gap, it has been believed in the past that the semiconductor does not emit light. Recently, however, it has been discovered that fine crystal particles of the semiconductor with a particle size of not more than 10 nm take a structural configuration of a direct transition type band and can emit light. This discovery has encouraged research activities on the utilization of such semiconductor particles.

Besides the above mentioned, there have been made a large number of research works on the quantum dot and/or quantum fine wire forming technology which are intended for application of such a semiconductor to many kinds of electrical and optical devices utilizing the principle of quantum effect. In this conjunction, a quantum dot forming method and application to one-electron transistors and light-emitting devices of quantum dots formed by the method (see Japanese Patent Application Laid-open Publication No. 8-64525) will be briefly explained.

FIG. 13F shows a section of a formed single electron transistor. A voltage is applied between a source terminal 1 and a drain terminal 2, and a current flowing between the source and the drain through crystal Si fine particles (hereinafter referred to as fine particles) 3 is on/off switched by a voltage applied to a gate terminal 4. In case where no voltage is applied to the gate terminal 4, no current flows to fine particles because of a Coulomb blockade phenomenon occurring to fine particles 3 due to quantum size effect. That is, the device is in off condition. When a voltage is applied to the gate terminal 4 to reduce the tunnel resistance between fine particles 3 to a level lower than the quantum resistance (h/4 (e * e), where h: Planck constant; e: elementary electric charge), the Coulomb blockade is broken to allow current flow. That is, the device is in on condition.

The one-electron transistor is formed in the following way. As shown in FIG. 13A, an $SiO_2$ film 6 having a thickness of 2500 Å is formed by conventional selective oxidization method on a surface portion, other than the device forming region, of a low-resistance Si wafer 5 having a resistivity of 0.003 $\Omega$cm, the $SiO_2$ film 6 serving as an isolation region. Next, heat treatment is carried out in an oxygen atmosphere to form an $SiO_2$ film 7 having a thickness of 40 Å on which is in turn formed a tungsten film 8 having a thickness of 1000 Å by CVD (chemical vapor deposition) method. Then, patterning is carried out by dry etching. Finally, the tungsten film 8 is used as a source and a drain.

Next, as shown in FIG. 13A, Si atoms are supplied at a deposition rate of 0.1 Å/sec to the surfaces of the $SiO_2$ film 7 and tungsten film 8 by an electron beam deposition method while heating is effected at 125° C. in an ultra high-vacuum tank. Thus, on the surfaces of the $SiO_2$ film 7 and tungsten film 8 are formed semispherical amorphous Si fine particles 9 of 20 Å in diameter and 10 Å in height at intervals of 20 Å. Then, the temperature is raised to 500° C. and heat treatment is carried out for 1 hour. Thus, the semispherical amorphous Si fine particles 9 are crystallized into fine particles 3 (crystallized Si fine particles).

Next, as shown in FIG. 13B, a boron/phosphorus-loaded glass 10 is deposited by a CVD method using $SiH_4$, $O_2$, $PH_3$, $B_2H_5$ as material gas, and the surface of the deposit is rendered flat by reflow through heat treatment at 800° C. so that the resulting layer is 40 Å thick at the region in which fine particles 3 are present and 50 Å thick at the region in which particles 3 are not present.

Next, as shown in FIG. 13C, a tungsten film 11 is deposited to be formed into a gate electrode configuration. Then, as shown in FIG. 13D, an $SiO_2$ film 12 is deposited by CVD technique to form an interlayer insulating film. Further, as shown in FIGS. 13E and 13F, wiring and passivation film forming are carried out, and then a source terminal 1, a drain terminal 2, a gate terminal 4, and a substrate potential terminal 13 are formed.

Next, applicability of above described quantum dots to light-emitting devices will be explained. FIG. 14F shows a section of a formed Si light-emitting device. The Si light-emitting device emits light when a voltage is applied between an upper electrode 15 and a lower electrode 16 to allow a tunnel current flow and carrier injection into crystal Si fine particles (hereinafter referred to as fine particles) 17.

An Si light-emitting device of above described configuration is formed in the following way. As shown in FIG. 14A, an $SiO_2$ film 19 having a thickness of 2500 Å is formed by conventional selective oxidization method on a surface portion, other than the device forming region, of a low-resistance Si wafer 5 having a resistivity of 0.003 $\Omega$cm, the $SiO_2$ film 6 serving as an isolation region. Next, as shown in FIG. 14B, heat treatment is carried out in an oxygen atmosphere to form an $SiO_2$ film 20 having a thickness of 30 Å.

Next, as shown in FIG. 14C, Si atoms are supplied at a deposition rate of 0.1 Å/sec to the surfaces of the $SiO_2$ films 19 and 20 by an electron beam deposition method while heating is effected at 125° C. in an ultra high-vacuum tank. Thus, on the surfaces of the $SiO_2$ films 19 and 20 are formed semispherical amorphous Si fine particles 21 of 20 Å in diameter and 10 Å in height at intervals of 20 Å. Then, the temperature is raised to 500° C. and heat treatment is carried out for 1 hour. Thus, the semispherical amorphous Si fine particles 21 are crystallized into fine particles 17.

Next, as shown in FIG. 14D, a boron/phosphorus-loaded glass 22 is deposited by a CVD method using $SiH_4$, $O_2$, $PH_3$, $B_2H_5$ as material gas, and the surface of the deposit is rendered flat by reflow through heat treatment at 800° C. so that the resulting layer is 30 Å thick at the region in which fine particles 17 are present and 40 Å thick at the region in which particles 17 are not present.

Next, as shown in FIG. 14E, deposition of ITO (indium tin oxide) film 23 is carried out by a sputtering process and the ITO film 23 is etched by using a mask of a desired configuration as such to form an upper electrode 15. Further, as shown in FIG. 14E, the boron/phosphorus-loaded glass 22 is etched by using the upper electrode 15 as a mask, so that the boron/phosphorus glass 22 and fine particles 17 in portions other than the electrode region are removed. Further, as shown in FIG. 14F, wiring and passivation film forming are carried out. An Si light-emitting device is thus formed.

Further, a method of forming quantum dots of metallic material is described in a lecture document, entitled "Generation of a Aluminum Cluster Coated with γ-Alumina" by Goto et al, which is contained in a collection of drafts for lectures made at "Ohyo Butsuri Gakkai" (the Japanese Applied Physics society) meeting for spring 1997, Lecture No. 28a-T-3, Lecture Collection p-1313. According to this method, a spherical aluminum cluster having a diametrical size of from 5 nm to 500 nm is formed by a magnetron sputter cohesion method such that aluminum (Al) is sputtered by DC discharge (220 V, 0.4 A) in argon (Ar) gas ($4 \times 10^{-3}$ Torr) so that Al cohesion can occur under the pressure of helium (He) gas (10 Torr) filled around the Al.

Next, one example of Si quantum fine wire forming method is explained. The method is described in a lecture document, entitled "Uniform Si Quantum Wires Fabricated by Anisotropic Etching on SIMOX Substrates" by Ishikuro et al, which is contained in a collection of drafts for lectures made at "Ohyo Butsuri Gakkai" (the Japanese Applied Physics society) meeting for spring 1996, Lecture No. 28a-PB-5, Lecture Collection p-798.

In the above noted Si quantum fine wire forming method,
i) as shown in FIG. 15A, after $Si_3N_4$ film 26 is deposited on (100) SIMOX (separation by implanted oxygen) substrate 25, patterning is carried out in (110) direction;
ii) as shown in FIG. 15B, by using the $Si_3N_4$ film 26 as a mask, anisotropic etching is carried out with tetramethyl ammonium-hydroxide (TMAH) to form a (111) plane 27 on the pattern edge;
iii) as shown in FIG. 15C, the (111) plane 27 is selectively oxidized by using the $Si_3N_4$ film 26 as a mask to form an oxide film 28; and
iv) as shown in FIG. 15D, after the $Si_3N_4$ film 26 is removed, anisotropic etching is carried out with TMAH by using the oxide film 28 as a mask, whereby an Si quantum fine wire 29 extending in the (110) direction is formed.

As stated in a lecture document, entitled "Room Temperature Observation of Coulomb Blockade Oscillations in a Si Quantum Wire MOSFET Fabricated by Anisotropic Etching" by Ishikuro et al, which is contained in a collection of drafts for lectures made at "Ohyo Butsuri Gakkai" (the Japanese Applied Physics society) meeting for spring 1996, Lecture No. 26p-ZA-12, Lecture Collection p-64, observations on the dependence of drain current upon gate voltage in a device formed in manner as described above have witnessed a Coulomb blockade phenomenon due to one-electron phenomenon with respect to drain current as shown in FIG. 16.

Further, a method of forming a quantum fine wire of metallic material is described in a lecture document, entitled "AFM Fabrication of Al-Wire" by Sakurai et al, which is contained in a collection of drafts for lectures made at "Ohyo Butsuri Gakkai" (the Japanese Applied Physics society) meeting for spring 1997, Lecture No. 30a-PB-4, Lecture Collection p-515. According to this method, an Al film, 30 μm wide and 8 nm thick, is vapor deposited on an $SiO_2$ insulating substrate. Next, regions other than Al fine wire are oxidized by using atomic force microscopy (AFM). More specifically, Al portions other than Al fine wire are oxidized by applying a voltage between the AFM probe and the Al so that Al portions other than Al fine wire are oxidized to form an insulating film. Thus, an Al fine wire of 20 nm in width is formed.

However, in order that quantum dots or quantum fine wires formed by conventional quantum dot or quantum fine wire forming method, and an Si-based LSI may be loaded on a common substrate and allowed to integrally function, the following problems must be solved.

First, the quantum dot forming method disclosed in Japanese Patent Application Laid-open Publication No. 8-64525 is such that crystal particles of ultrafine particle size are formed on a substrate surface covered with an insulating film by utilizing an electron beam vapor deposition method, so that the condition of the substrate surface and the atmosphere (presence or absence of impurities) of the reaction chamber exert strong effect on the position and time for generation of a crystal nucleus which promotes growth of crystal particles, and particle growth after crystal nucleus generation. Therefore, it is very difficult to secure the position of crystal particle growth, particle size, uniformity of particle density, and reproducibility. As such, the method is unacceptable for mass production purposes.

The quantum dot forming method described in the lecture document "Generation of a Aluminum Cluster Coated with γ-alumina" by Goto et al is a method which utilizes the process of sputtering and cohesion reaction in vapor phase. In the case of this method, too, it is very difficult to secure the position of crystal particle growth, particle size, uniformity of particle density, and reproducibility. As such, the method is unacceptable for mass production purposes.

The quantum fine wire forming method described in the lecture document "Uniform Si Quantum Wires Fabricated by Anisotropic Etching on SIMOX Substrates" by Ishikuro et al requires a very complicated process and involves various problems, such as high cost, low yield, and low productivity. Therefore, this method is unacceptable from the standpoint of realistic mass production.

The quantum fine wire forming method described in the lecture document "AFM Fabrication of Al-Wire" by Sakurai et al requires a very special type of miniaturizing technique which involves the use of an AFM (atomic force microscope), but in the current status of the art there exists no AFM which enables formation of fine wires at desired positions over the entire surface of the substrate. Another problem is how to form fine wires of uniform width with good reproducibility. Further, for development of necessary mass production equipment, there are many problems to be solved, including the problem of alignment and the securement of a realistic throughput.

SUMMARY OF THE INVENTION

It is an object of the present invention to provide a quantum dot and quantum fine wire forming method which can allow control of the position for crystalline particle growth and enables formation of particles with high uniformity in size and density and with high reproducibility, and which can realize low cost production, high yield, and high productivity.

It is another object of the invention to provide a semiconductor device incorporating quantum dots and/or quantum fine wire formed by the quantum dot and quantum fine wire forming method.

In order to achieve the above object, there is provided an ultrafine particle and/or ultrafine wire forming method for forming metallic or semiconductor ultrafine particles and/or ultrafine wire having electric conductivity on an insulative substrate, which comprises:

preparing an insulative substrate formed with a step, and selectively forming the ultrafine particles and/or ultrafine wire along the upper edge of the step.

According to the above arrangement, metallic and/or semiconductor ultrafine particles and/or ultrafine wires are selectively formed along the upper edge of the step formed on the insulative substrate. Therefore, the position for growth of ultrafine particles and/or ultrafine wires can be set at the desired position by controlling the position for forming the step on the insulative substrate.

In an embodiment of the present invention, the step is not less than 1 nm in height.

According to the above arrangement, ultrafine particles and/or ultrafine wires can be accurately formed along the upper edge of a step formed on the insulative substrate which has a height of not less than 1 nm.

In an embodiment of the present invention, preparation of the insulative substrate formed with the step is made by forming the step on a surface of the insulative substrate.

According to the above arrangement, a step is formed on the insulative substrate by using conventional film forming technique, photolithography, and dry etching technique. Therefore, the position for step formation on the insulative substrate can be easily controlled so that the position for growth of ultrafine particles and/or ultrafine wire can be easily set at the desired location.

In an embodiment of the present invention, preparation of the insulative substrate formed with the step is carried out by forming the step on a surface of a semiconductor substrate, then forming an insulative film on the surface of the semiconductor substrate formed with the step.

According to the above arrangement, a step is formed on the insulative substrate by using conventional film forming technique, photolithography, dry etching technique, and selective oxidization technique. Therefore, the position for step formation on the insulative substrate can be easily controlled so that the position for growth of ultrafine particles and/or ultrafine wire can be easily set at the desired location.

In an embodiment of the present invention, preparation of the insulative substrate formed with the step is carried out by forming an insulative film on a surface of a semiconductor substrate, then patterning the insulative film to expose the surface of the semiconductor substrate, thus oxidizing the exposed surface of the semiconductor substrate.

According to the above arrangement, a step is formed on the insulative substrate by using conventional film forming technique, photolithography, and dry etching technique. Therefore, the position for step formation on the insulative substrate can be easily controlled so that the position for growth of ultrafine particles and/or ultrafine wire can be easily set at the desired location.

In an embodiment of the present invention, preparation of the insulative substrate formed with the step is carried out by forming an insulative film on a surface of a semiconductor substrate, then patterning the insulative film to expose the surface of the semiconductor substrate, then laying an insulative film over the entire surface of the semiconductor substrate.

According to the above arrangement, a step is formed on the insulative substrate by using conventional film forming technique, photolithography, and dry etching technique. Therefore, the position for step formation on the insulative substrate can be easily controlled so that the position for growth of ultrafine particles and/or ultrafine wire can be easily set at the desired location.

In an embodiment of the present invention, selective formation of the ultrafine particles or ultrafine wire along the upper edge of the step is carried out by introducing an insulative substrate formed with the step into a reaction chamber, evacuating the interior of the reaction chamber once to a high vacuum of not more than $10^{-6}$ Torr, then feeding material gas into the chamber to enable vapor phase growth of the ultrafine particles or ultrafine wire only along the upper edge of the step under a partial pressure of not more than $10^{-2}$ Torr of the material gas.

According to the above arrangement, selective growth of ultrafine particles and/or ultrafine wire along the upper edge of the step is carried out by conventional high-vacuum CVD technique without necessity of using any special fine processing technique. Therefore, by controlling the degree of vacuum in the reaction chamber, the quantity and time period of material gas feed, and the temperature of the substrate, it is possible to allow ultrafine particles and/or ultrafine wires of the desired size and thickness to be uniformly and well reproducibly formed in the desired density. Further, according to this invention, ultrafine particles and ultrafine wires can be formed by a simple process, and therefore low cost, high yield, and high productivity can be realized.

In an embodiment of the present invention, the ultrafine particles or the ultrafine wire is selectively formed by controlling at least one of the rate of gas flow, the time period of gas inflow, and the temperature of the substrate when the material gas is fed into the reaction chamber.

According to the above arrangement, without involving any change in the device and/or procedure, ultrafine particles or an ultrafine wire comprised of such particles connected in chain can be selectively formed in a simple way by controlling at least one of the flow rate of the gas introduced into the reaction chamber, the time period of gas inflow, and the temperature of the substrate.

In an embodiment of the present invention, the material gas is monosilane ($SiH_4$), disilane ($Si_2H_6$) trisilane ($Si_3H_8$), dichlorosilane ($SiH_2Cl_2$) or tetrachlorosilane ($SiCl_4$), and forms ultrafine silicon particles or ultrafine silicon wire.

According to the above arrangement, ultrafine particles and/or ultrafine wires of Si (semiconductor) of the desired size and thickness can be easily formed in the desired density by conventional film forming technique, and conventional photolithography, dry etching technique or selective oxidization technique, and conventional high-vacuum CVD technique, without employing any special fine processing technique.

In an embodiment of the present invention, the material gas is germane ($GeH_4$), digermane ($Ge_2H_6$), or germanium fluoride ($GeF_4$), and forms ultrafine germanium particles or ultrafine germanium wire.

According to the above arrangement, ultrafine particles and/or ultrafine wires of Ge (semiconductor) of the desired size and thickness can be easily formed in the desired density by conventional film forming technique, and conventional photolithography, dry etching technique or selective oxidization technique, and conventional high-vacuum CVD technique, without employing any special fine processing technique.

In an embodiment of the present invention, the material gas is a mixture gas of any one of monosilane ($SiH_4$), disilane ($Si_2H_6$), trisilane ($Si_3H_8$), dichlorosilane ($SiH_2Cl_2$), and tetrachlorosilane ($SiCl_4$), and any one of germane ($GeH_4$), digermane ($Ge_2H_6$), and germanium fluoride ($GeF_4$), and forms ultrafine particles or wire of germanium silicate.

According to the above arrangement, ultrafine particles and/or ultrafine wires of SiGe of the desired size and thickness can be easily formed in the desired density by conventional film forming technique, and conventional photolithography or dry etching technique or selective oxidization technique, and conventional high-vacuum CVD technique, without employing any special fine processing technique.

In an embodiment of the present invention, the material gas is organic aluminum and forms ultrafine particles or wire of aluminum.

According to the above arrangement, ultrafine particles and/or ultrafine wires of Al (metal) of the desired size and thickness can be easily formed in the desired density by conventional film forming technique, and conventional photolithography, dry etching technique or selective oxidization technique, and conventional high-vacuum CVD technique, without employing any special fine processing technique.

In order to achieve the above other object, there is provided a semiconductor memory including a source region, a drain region, a channel region provided between the source region and the drain region, a gate region for controlling a channel current flowing in the channel region, a floating gate region provided between the channel region and the gate region, a first insulative film provided between the floating gate region and the gate region, and a second insulative film provided between the channel region and the floating gate region, wherein Ultrafine particles and/or ultrafine wire formed according to the above ultrafine particle and/or ultrafine wire forming method is used as the floating gate.

According to the above arrangement, the floating gate is comprised of ultrafine particles and/or ultrafine wires, so that charge accumulation at the floating gate can be reduced. This enables the semiconductor device to operate with a smaller amount of charge injection into the floating gate. According to this invention, it is possible to produce a ultrahigh density and large capacity nonvolatile memory, with less power consumption, low cost, high yield, and high productivity.

In an embodiment of the present invention, there is provided a semiconductor memory including a source region, a drain region, a channel region provided between the source region and the drain region, a gate region for controlling a channel current flowing in the channel region, and an insulative film provided between the channel region and the gate region, wherein an ultrafine semiconductor wire formed according to the above ultrafine particle and/or ultrafine wire forming method is used as the channel region.

According to the above arrangement, the channel region is formed of an ultrafine semiconductor wire of nanometer size and is therefore quantized in a direction orthogonal to the direction in which the ultrafine wire extends, so that the channel region exhibits one-dimensional conduction. Therefore, the semiconductor device operates at high speed. Therefore, according to this invention, it is possible to produce a high-speed operating MOSFET at low cost, and with high yield and high productivity.

In an embodiment of the present invention, there is provided a semiconductor device comprising a structure such that ultrafine semiconductor particles formed according to the above ultrafine particle and/or ultrafine wire forming method are held between insulative films, with the insulative films held between electrodes, the semiconductor device being caused to emit light by a voltage being applied between the electrodes.

According to the above arrangement, the ultrafine semiconductor particles have a band structure of direct transition type. Therefore, when a voltage is applied to the two electrodes between which are held the ultrafine particles through the insulative films, thereby to cause a tunnelling current to flow for electron injection into ultrafine particles, electron transition in the ultrafine particles occurs to effect light emission. In other words, the semiconductor device of the present invention functions as a light-emitting device. Further, it is possible to mount a photoelectric conversion device including the above described semiconductor device on an LSI substrate. Therefore, according to the present invention, it is possible to incorporate an electronic circuitry and an optical communication circuitry into a harmonious unity.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 8A and 8B are sectional views of the quantum dots and quantum fine wire, respectively, taken along the line B—B in FIG. 6;

FIGS. 9A through 9C are views showing a MOSFET using, as a channel, a quantum fine wire formed by using one of the step forming procedures illustrated in FIGS. 1, 2, 4 and 5;

FIGS. 15A through 15D are explanatory views illustrating a conventional method of producing a quantum fine wire; and FIG. 16 is a graphic representation showing the dependence on gate voltage of drain current in a device using a quantum fine wire formed by the producing method illustrated in FIG. 15.

DETAILED DESCRIPTION OF THE PREFERRED EMBODIMENTS

The present invention will now be described in further detail with reference to the preferred embodiment illustrated in the accompanying drawings.

In the present embodiment, a step is previously formed on an insulative substrate. Thereafter, quantum dots or quantum wires are selectively formed from a metallic material having electric conductivity or from semiconductor along the upper edge of the step. Specifically, the step is formed in the following way:

i) an insulating material is worked to form a step;

ii) a semiconductor substrate is worked to form a step thereon, and then an insulating film is formed on the surface of the substrate; and iii) after the insulating film is formed on the semiconductor surface, patterning is carried out with respect to the insulating film to expose the semiconductor surface, and a step is formed by oxidizing the exposed surface or depositing an insulating film over the entire exposed surface.

Figure 11A:
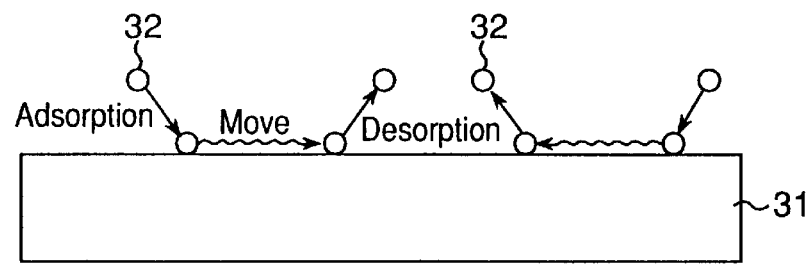
FIGS. 11A through 11D are explanatory views illustrating the forming process of a thin film being formed from a reaction gas molecule.
Figure 11B:
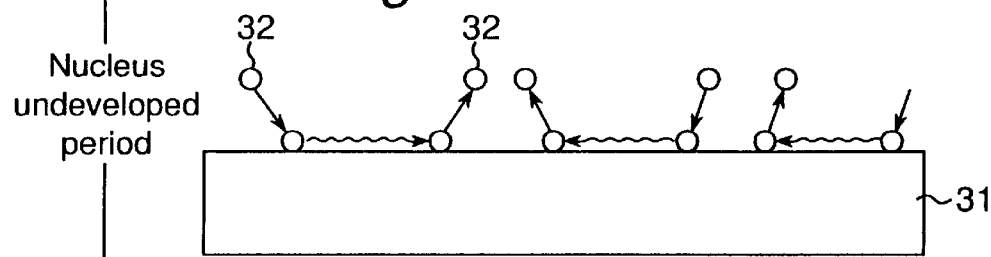
Figure 11C:
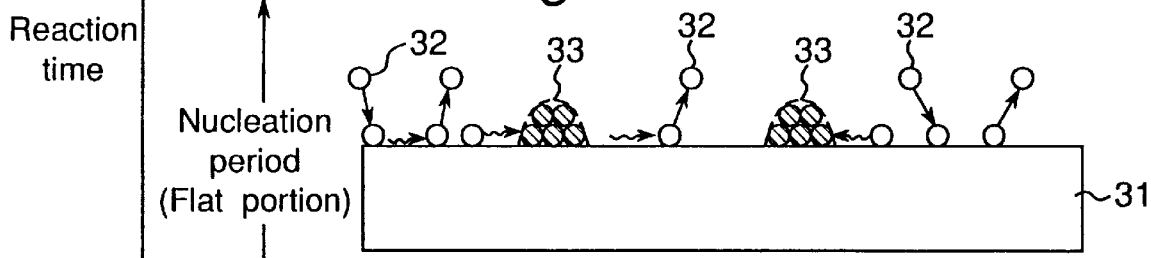
Figure 11D:
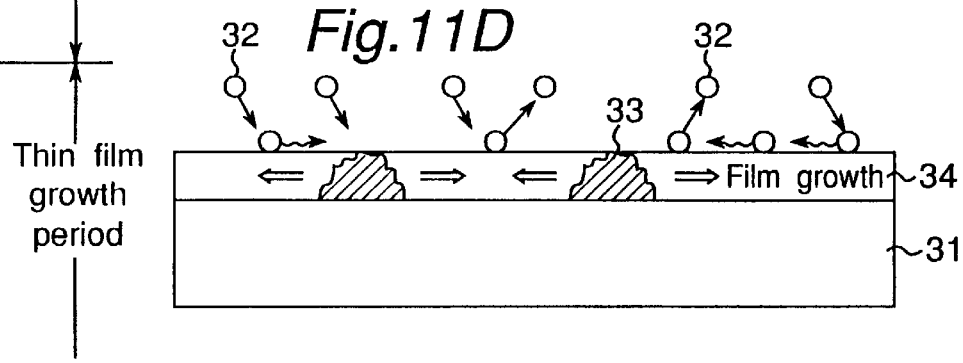

The substrate which is formed with the step in this way is introduced into a reaction chamber, and the interior of the reaction chamber is evacuated once to a high vacuum of $10^{-6}$ Torr or lower, material gas being then fed into the chamber. Thus, under a material gas partial pressure of $10^{-2}$ Torr or lower, vapor phase growth of quantum dots and/or quantum fine wires is allowed only at a portion extending along the upper edge of the step.

Where a trace amount of a reaction gas is fed in a highly clean atmosphere under high vacuum, as shown in FIGS. 11A and 11B, in a certain initial time period, adsorbed reaction gas molecules 32 move on the flat surface of the insulative substrate 31 until they are desorbed, with the result that nothing is formed on the surface. However, as shown in FIG. 11C, when a nucleus 33 is formed on the surface of the insulative substrate 31 after lapse of a certain time period, the nucleus grows into an island-like film, which is finally formed into a continuous thin film 34 as shown in FIG. 1D.

Figure 12A:
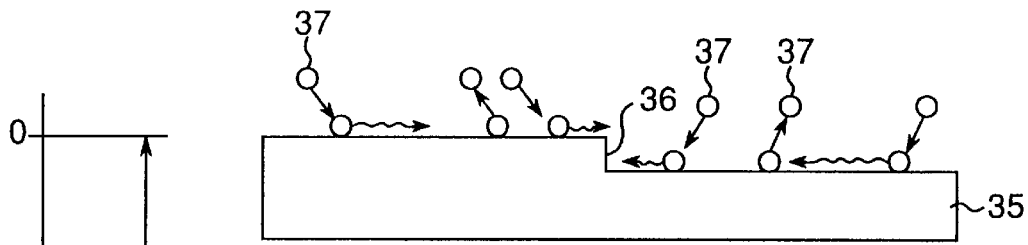
FIGS. 12A through 12D are explanatory views illustrating the forming process of quantum dots and quantum fine wire according to the invention.
Figure 12B:
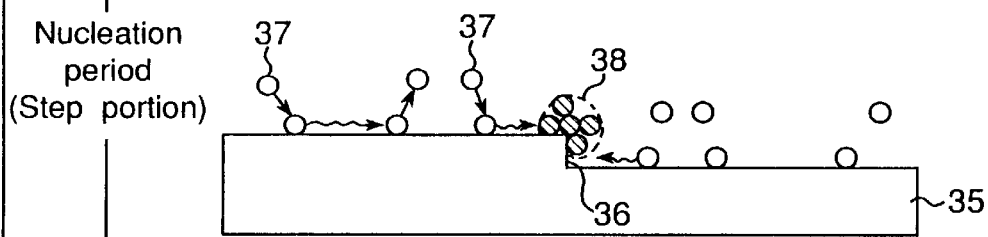
Figure 12C:
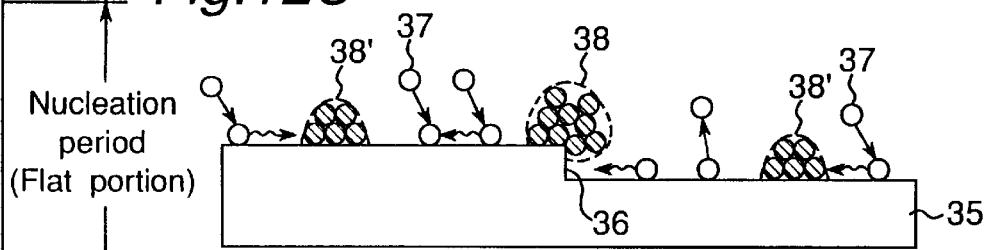
Figure 12D:
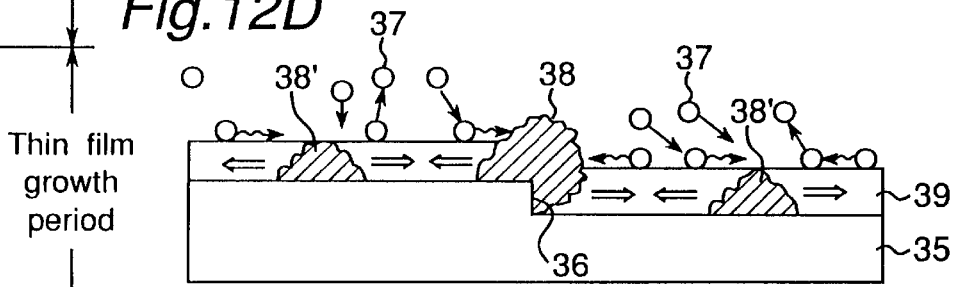
Figure 13A:
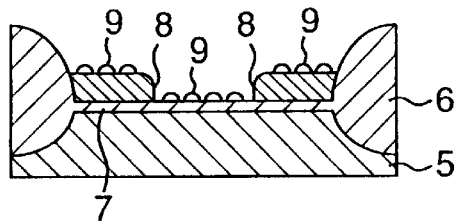
FIGS. 13A through 13F are explanatory views illustrating a conventional method of producing quantum dots, and a single-electron transistor using such quantum dots.
Figure 13B:
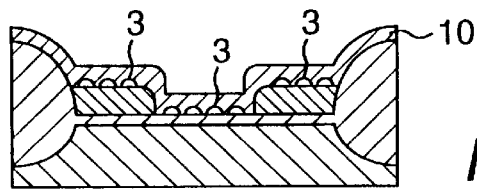
Figure 13C:
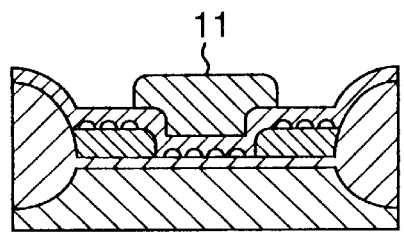
Figure 13D:
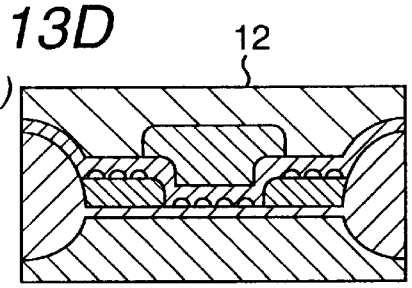
Figure 13E:
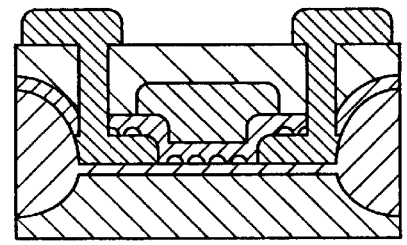
Figure 13F:
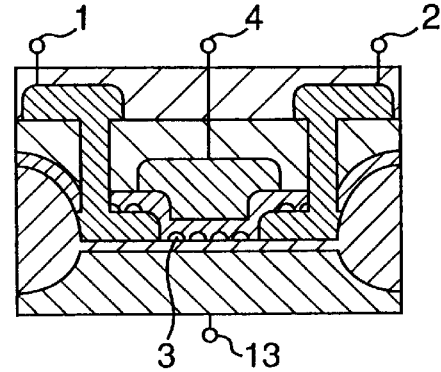
Figure 14A:
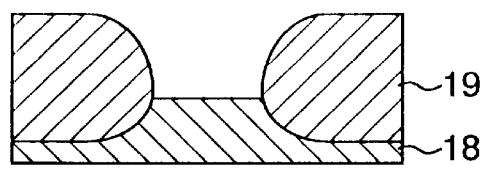
FIGS. 14A through 14F are explanatory views illustrating a conventional method of producing quantum dots, and a light emitting device using such quantum dots.
Figure 14B:
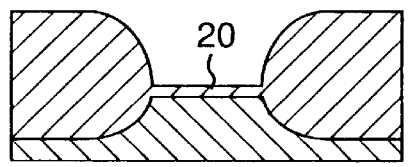
Figure 14C:
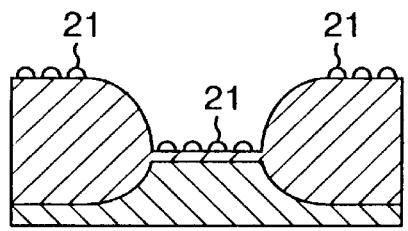
Figure 14D:
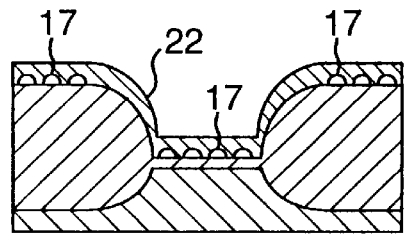
Figure 14E:
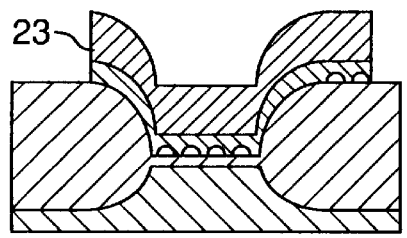
Figure 14F:
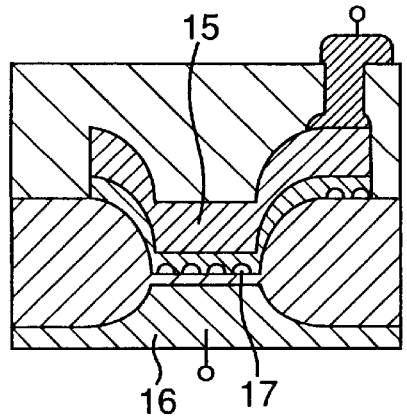

However, where a step exists on the surface of the substrate, as shown in FIG. 12B, a nucleus (a granular reactant) 38 is formed along the upper edge of the step 36 of the insulative substrate 35 even at the initial stage, in which no nucleus is formed on the flat surface of FIG. 11. Further, upon the lapse of aforesaid certain time period, a nucleus 38' is formed on the surface of the insulative substrate 35 as shown in FIG. 12C. The nucleuses 38, 38' finally grow into an island-like film to form a continuous thin film 39. Conceivably, the reason why reactant 38 grows along the step 36 is that the concentration of reaction gas molecule 37 at the step 36 is higher than that at the flat portion. As far as the CVD process is concerned, there is no case example where a reactant tends to grow at a step portion in such a way, though there are some case examples in epitaxial growth.

In order to avoid occurrence of nucleation on a flat portion of the insulative substrate for a given time period, it is necessary that the interior of the reaction chamber be evacuated once to a higher vacuum than $10^{-6}$ Torr thereby to eliminate impurities such as atmospheric components and moisture. Also, it is necessary that the pressure within the reaction chamber be reduced to a pressure level of not higher than $10^{-2}$ Torr. The reason for this is that if the pressure is higher than $10^{-2}$ Torr, film growth will begin rapidly over the entire surface. It is also necessary that the step be not less than 1 nm in height, because nucleation will not occur if the surface irregularity of an Si wafer is less than 1 nm.

If quantum dots or quantum wires are to be formed of Si, then $SiH_4$ (monosilane), $Si_2H_6$ (disilane), $Si_3H_8$ (trisilane), $SiH_2Cl_2$ (dichlorosilane), or $SiCl_4$ (tetrachlorosilane) is used as material gas.

If quantum dots or quantum wires are to be formed of Ge (germanium), then $GeH_4$ (germane), $Ge_2H_6$ or $GeF_4$ (germanium fluoride) is used as material gas.

If quantum dots or quantum wires are to be formed of SiGe, then a mixture gas of one of $SiH_4$, $Si_2H_6$, $Si_3H_8$, $SiH_2Cl_2$, and $SiCl_4$, and one of $GeH_4$, $Ge_2H_6$ and $GeF_4$ is used as material gas.

If quantum dots or quantum wires are to be formed of Al, then an organic aluminum, such as $(CH_3)_2AlH$ (DMAH: dimethyl aluminum), is used as material gas.

Further, by fabricating a semiconductor device described below using quantum dots and/or quantum wires formed in such a way as above described it is possible to obtain a semiconductor device such that quantum dots and/or quantum fine wires which function as a key part of a quantum effect element or a single-electron element are loaded, together with a conventional Si-based LSI, in harmonious relation on a common substrate.

(1) In a semiconductor memory device comprising a source region, a drain region, a channel region provided between the source region and the drain region, a gate region for controlling a channel current flowing in the channel region, a floating gate region located between the channel region and the gate region, a first insulating film between the floating gate region and the gate region, and a second insulating film between the channel region and the floating gate region, aforesaid quantum dots and/or quantum fine wires are used for the floating gate region.

(2) In a semiconductor device comprising a source region, a drain region, a channel region between the source region and the drain region, a gate region for controlling a channel current flowing in the channel region, and an insulating film between the channel region and the gate region, aforesaid quantum fine wires are used for the channel region.

(3) Quantum dots of semiconductor material are held between insulating films and further between electrodes so that they can function as light-emitting elements upon application of a voltage between the electrodes.

The present embodiment will be more specifically described with respect to the method of forming quantum dots and/or quantum fine wires and a semiconductor device using quantum dots and/or quantum fine wires formed by the method.

EMBODIMENT 1

FIG. 1 shows the procedure involved in the method of forming quantum dots and/or quantum fine wires. This Embodiment 1 relates to the earlier mentioned step forming method ii), that is, a method wherein a semiconductor substrate is worked to enable a step to be formed thereon, and then an insulating film is formed on the surface of the substrate.

Figure 1A:
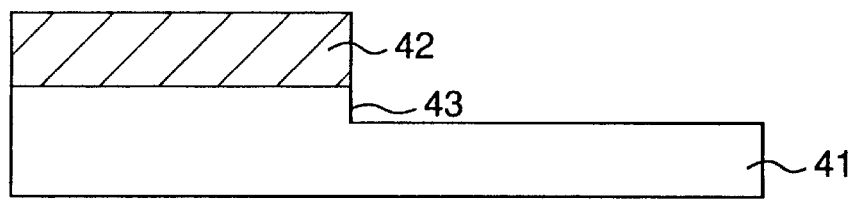
FIGS. 1A through 1D are a series of views illustrating one procedure in the ultrafine particle and ultrafine wire forming method of the present invention.
Figure 1B:
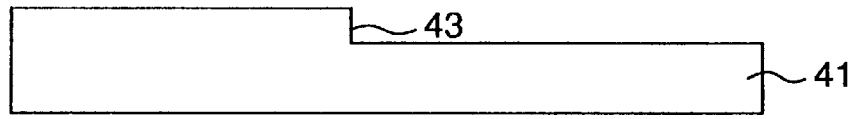
Figure 1C:
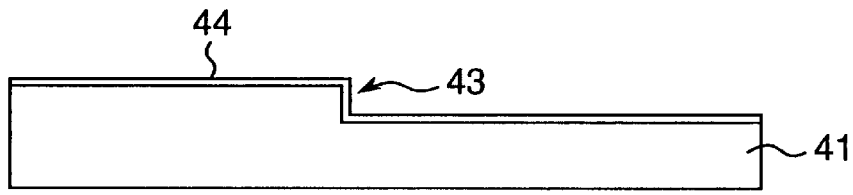
Figure 1D:
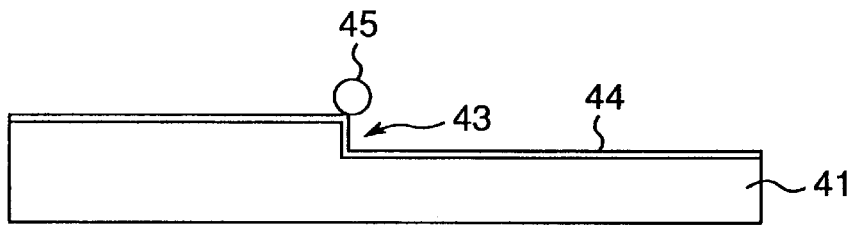
Figure 2A:
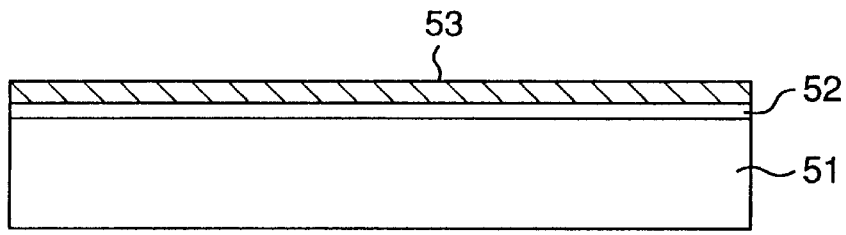
FIGS. 2A through 2D are a series of views illustrating a step forming procedure different from the step forming procedure shown in FIG. 1.
Figure 2B:
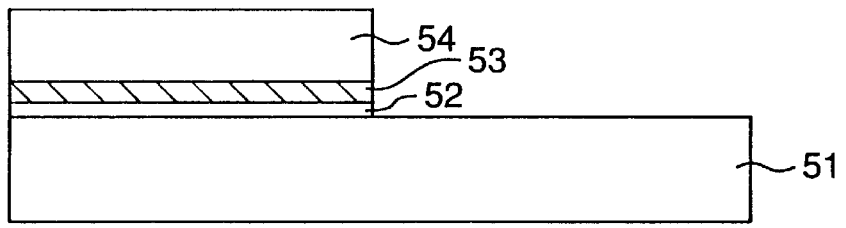
Figure 2C:
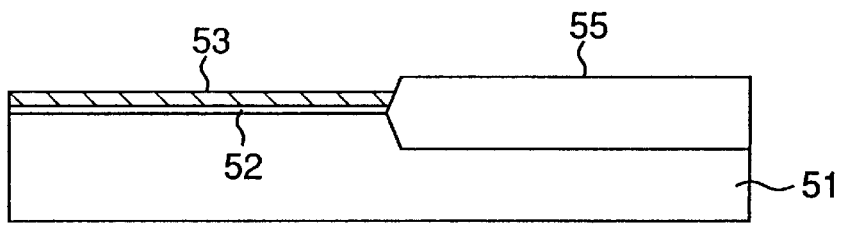
Figure 2D:
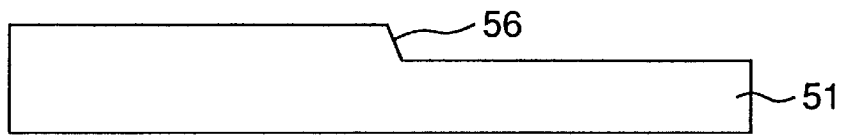

That is, as shown in FIG. 1A, after a photoresist film is formed on Si substrate 41, patterning is carried out to provide a photomask 42, with the position for the step set as a boundary. Dry etching is carried out to form a step 43 of 50 nm in height on the Si substrate 41. Then, the photomask 42 is removed as shown in FIG. 1B. Then, as shown in FIG. 1C, thermal oxidization is carried out to form an $SiO_2$ film 44 over the entire surface. Instead of forming an $SiO_2$ film 44 by thermal oxidation, an insulating film, such as $SiO_2$ film or $Si_3N_4$ film, may be formed by CVD process, or an insulating film comprising $SiO_2$ film and $Si_3N_4$ film in lamination may be formed.

Thereafter, the Si substrate 41 with step 43 formed thereon is set in a reaction chamber comparable to a high-vacuum CVD apparatus and the reaction chamber is vacuum-evacuated to about $10^{-8}$ Torr. Then, 18 cc of $Si_2H_6$ gas is fed for 120 seconds under the pressure of not more than $10^{-2}$ Torr. In this conjunction, the temperature at the substrate is 590° C. Thus, as shown in FIG. 1D, Si crystal particles having a particle size of about 30 nm are formed only along the step 43.

Whereas FIG. 1 illustrates the procedure for forming such a step by dry etching, FIG. 2 shows the procedure for forming a similar step by local oxidation of silicon (LOCOS). As shown in FIG. 2A, an oxide film 52 and a nitride film 53 are sequentially formed on an Si substrate 51. Then, as shown in FIG. 2B, a photoresist film is formed and, with the position for step forming set as a boundary, patterning is carried out to obtain a photomask 54. Then, as shown in FIG. 2C, selective oxidation is carried out by the LOCOS technique to form a LOCOS oxide film 55. Thereafter, as shown in FIG. 2D, oxide film 52, nitride film 53, and LOCOS oxide film 55 are removed, whereby an Si substrate 51 formed with a 50 nm step 56 is obtained.

Thereafter, treatment steps similar to those subsequent to FIG. 1C in the method of forming quantum dots and/or quantum fine wires illustrated in FIG. 1 are carried out to form an $SiO_2$ film having a thickness of 5 nm over the entire surface. Then, the reaction chamber is vacuum-evacuated to the order of $10^{-8}$ Torr, and 18 cc of $Si_2H_6$ gas is made to flow for 120 seconds under the pressure of not more than $10^{-2}$ Torr. Thus, as shown in FIG. 1D, Si crystal particles having a particle size of about 30 nm are formed only along the upper edge of the step 56.

Figure 3A:
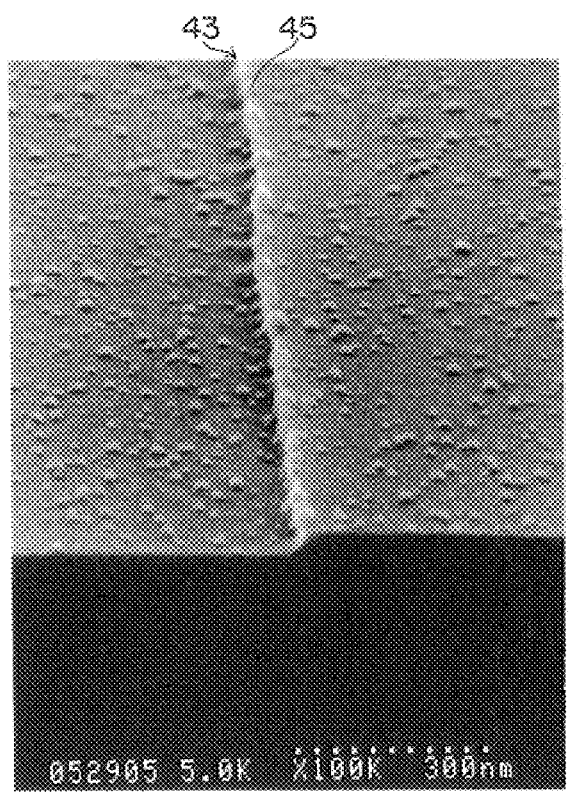
FIGS. 3A through 3B are scan electron-microscope photo views schematically showing quantum dots formed by the forming method of FIG. 1.
Figure 3B:
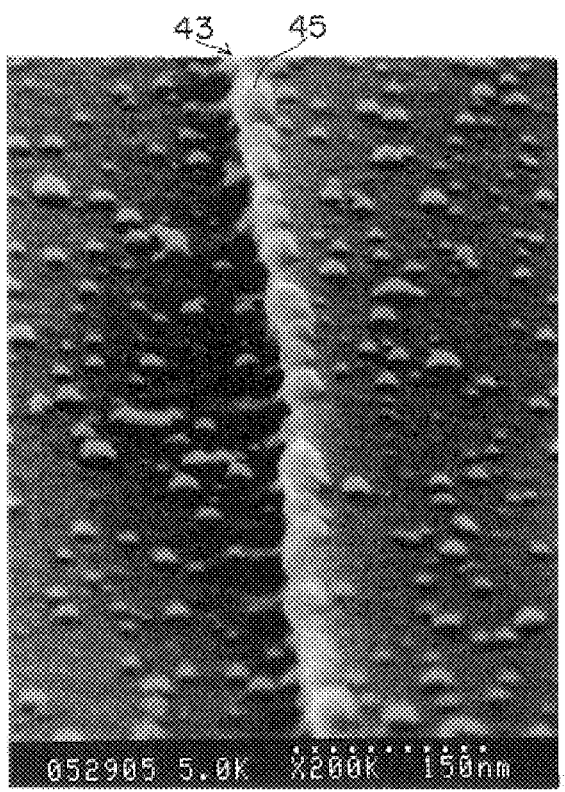

FIGS. 3A and 3B are scanning electron-microscope photo views schematically showing Si crystal particles being formed when $Si_2H_6$ gas was made to flow for a time period (240 sec) in which nucleation began also at a flat portion of the substrate. While granulation can be seen even on a flat portion, it is clear that there was substantial growth of Si crystal particles along the step 43. It is noted that FIG. 3A is shown on a magnified scale of ×100,000 and FIG. 3B on a magnified scale of ×200,000.

As earlier stated, in the present embodiment, after Si substrates 41, 51 are processed for forming steps 43, 56 thereon, an $SiO_2$ film (insulating film) 44 is formed on the substrate surface. After the interior of the reaction chamber is vacuum-evacuated to about $10^{-8}$ Torr, 18 cc of $Si_2H_6$ gas is made to flow under the pressure of not more than $10^{-2}$ Torr for 120 seconds so that Si crystal particles 45 having a size of about 30 nm can be formed along the steps 43, 56. Therefore, by setting positions for the steps 43, 56 to be formed on the Si substrates 41, 51 it is possible to properly set the position for growth of Si crystal particles 45 at the desired position.

In this case, the steps 43, 56 are formed by conventional photolithography and dry etching or LOCOS technique and, therefore, such position setting can be easily controlled. In other words, according to the present embodiment, the position for growth of quantum dots can be easily controlled.

In the present embodiment, for the growth of Si crystal particles (quantum dots) 45 the flow amount of $Si_2H_6$ gas is set at 18 cc, time period of flow at 120 seconds, and substrate temperature at 590° C. By controlling the flow amount of gas, the time period of flow, and substrate temperature it is possible to form discrete quantum dots or a quantum fine wire composed of quantum dots connected in succession. It is also possible to control the size of quantum dots and thickness of quantum fine wires. That is, according to the present embodiment it is possible to realize high uniformity in size, thickness, and density of quantum dots and quantum fine wires.

In this way, the method of forming quantum dots and/or quantum wires according to this embodiment can be carried out by simple processes, such as conventional photolithography, dry etching, LOCOS technique, and CVD process and does not require any special fine processing technique. This makes it possible to produce quantum dots and quantum fine wires in such a way as will assure low cost, high yield and high productivity.

In the above described embodiment, $Si_2H_6$ gas is used for developing Si quantum dots 45; but as already stated, $SiH_4$, $Si_3H_8$, $SiH_2Cl_2$, or $SiCl_4$ may be used as material gas. When $GeH_4$, $Ge_2H_6$ or $GeF_4$ is used as material gas, Ge quantum dots can be formed. It is possible to form SiGe quantum dots by using a mixture gas of one of $SiH_4$, $Si_2H_6$, $Si_3H_8$, $SiH_2Cl_2$, or $SiCl_4$ and one of $GeH_4$, $Ge_2H_6$ or $GeF_4$ as material gas. It is also possible to form Al (metal) quantum dots by using organic aluminum, such as DMAH, as material gas.

In the above connection, material for quantum dots and/or quantum fine wires is not limited to Si, Ge, and SiGe in the case of semiconductor. Nor is the material limited to Al in the case of metal.

EMBODIMENT 2

FIG. 4 shows a step forming procedure in the method of forming quantum dots and/or quantum fine wires. This Embodiment 2 relates to the earlier mentioned step forming method i), that is, a method wherein an insulating material is processed to cause a step to be formed thereon.

Figure 4A:
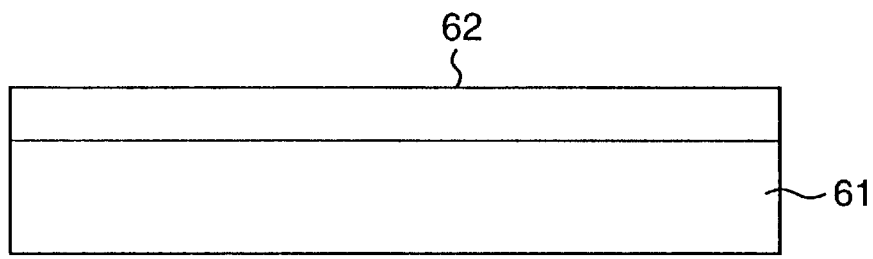
FIGS. 4A through 4C are a series of views illustrating a step forming procedure different from the step forming procedures shown in FIGS. 1 and 2.
Figure 4B:
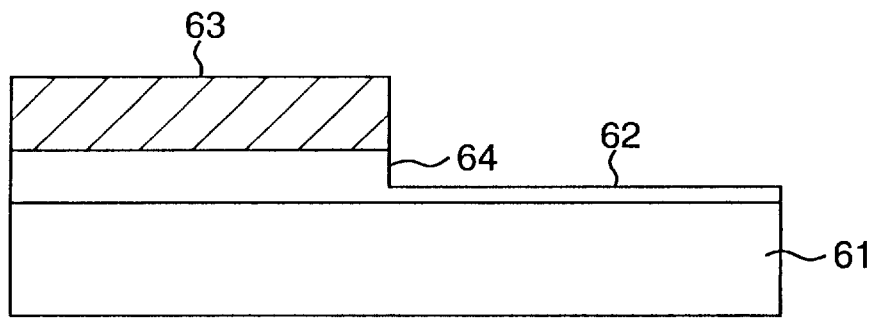
Figure 4C:
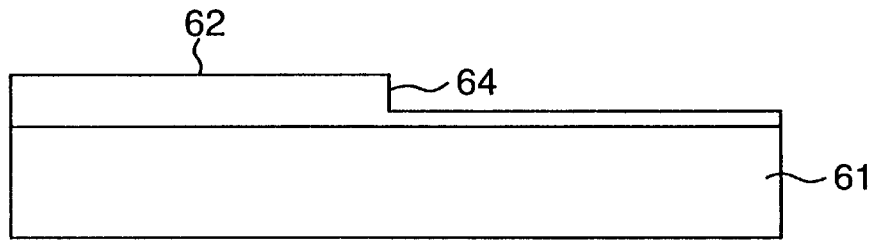

As shown in FIG. 4A, an SiO$_2$ film 62 having a thickness of 10 nm is formed by thermal oxidation on an Si substrate 61. Then, as shown in FIG. 4B, a photomask 63 is formed by conventional photolithography. Then, a step 64 is formed on the SiO$_2$ film (thermally oxidized film) 62 by dry etching and, thereafter, as shown in FIG. 4C, the photomask 63 is removed, whereby a substrate formed with a step 64 is obtained. Instead of forming the SiO$_2$ film 62 by thermal oxidation, an insulating film, such as SiO$_2$ film or Si$_3$N$_4$ film, or a laminate of SiO$_2$ and Si$_3$N$_4$, may be formed by CVD process.

Thereafter, treatment steps similar to those subsequent to FIG. 1D in the quantum dot and quantum wire forming method shown in FIG. 1 are carried out to form quantum dots. That is, the interior of the reaction chamber is evacuated to a high vacuum of about 10$^{-8}$ Torr, and material gas for forming quantum dots is made to flow under the pressure of not more than 10$^{-2}$ Torr thereby to allow quantum dots to be formed along the step 64.

EMBODIMENT 3

FIG. 5 shows a step forming procedure in the method of forming quantum dots and/or quantum fine wires. This Embodiment 3 relates to the earlier mentioned step forming method iii), that is, a method wherein after an insulating film is formed on the surface of a semiconductor, patterning is carried out with respect to the insulating film to expose the semiconductor surface for forming a step thereon by oxidation or depositing an insulating film over the entire surface.

Figure 5A:
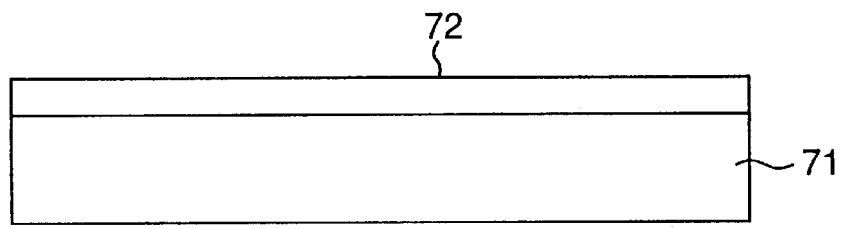
FIGS. 5A through 5C are a series of views illustrating a step forming procedure different from the step forming procedures shown in FIGS. 1, 2 and 4.
Figure 5B:
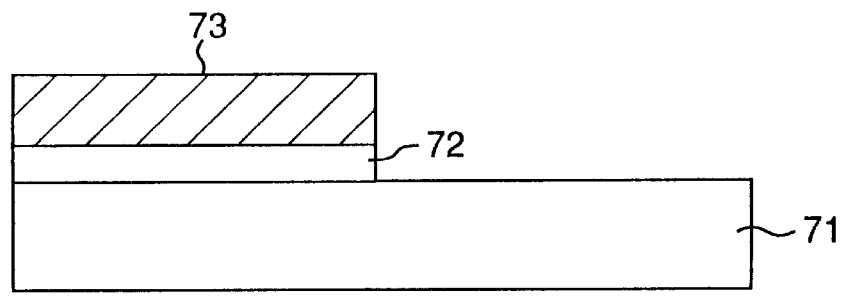
Figure 5C:
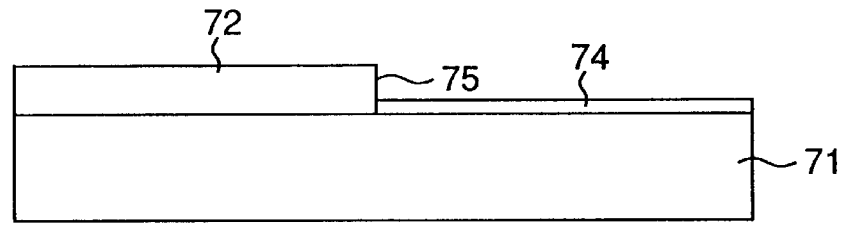

As shown in FIG. 5A, an SiO$_2$ film 72 having a thickness of 10 nm is formed by thermal oxidation on an Si substrate 71. Then, as shown in FIG. 5B, a photomask 73 is formed by conventional photolithography. Thereafter, patterning of the SiO$_2$ film (thermally oxidized film) 72 is carried out by dry etching to expose the Si substrate 71. Then, as shown in FIG. 5C, an oxide film 74 having a thickness of 4 nm is formed on the Si substrate 71 at the exposed portion. Then, the photomask 73 is removed, and a step 75 is thus formed at the boundary between the 10 nm thick SiO$_2$ film 72 and the 4 nm thick oxide film 74.

Instead of forming the SiO$_2$ film 72 by thermal oxidation, an insulating film, such as SiO$_2$ film or Si$_3$N$_4$ film, or a laminate of SiO$_2$ and Si$_3$N$_4$, may be formed by CVD process. Instead of forming the oxide film 74 over the exposed portion of the Si substrate 71, an insulating film may be placed over the entire upper surface of the Si substrate 71 which is partially covered with SiO$_2$ film 72.

Thereafter, treatment steps similar to those subsequent to FIG. 1D in the quantum dot and quantum wire forming method shown in FIG. 1 are carried out to form quantum dots. That is, the interior of the reaction chamber is evacuated to a high vacuum of about 10$^{-8}$ Torr, and material gas for forming quantum dots is made to flow under the pressure of not more than 10$^{-2}$ Torr thereby to allow quantum dots to be formed along the step 75.

In the foregoing embodiments, Si is used for the substrate. It is understood, however, that a semiconductor substrate other than Si or an insulating substrate, such as sapphire, graphite, or glass may be used without departing from the spirit and scope of the present invention.

EMBODIMENT 4

This embodiment concerns the case where quantum dots or quantum fine wires formed by any of the forming methods described hereinbefore are applied to the floating gate of a nonvolatile flash memory, such as EEPROM (electrically erasable and programmable read only memory).

Figure 6:
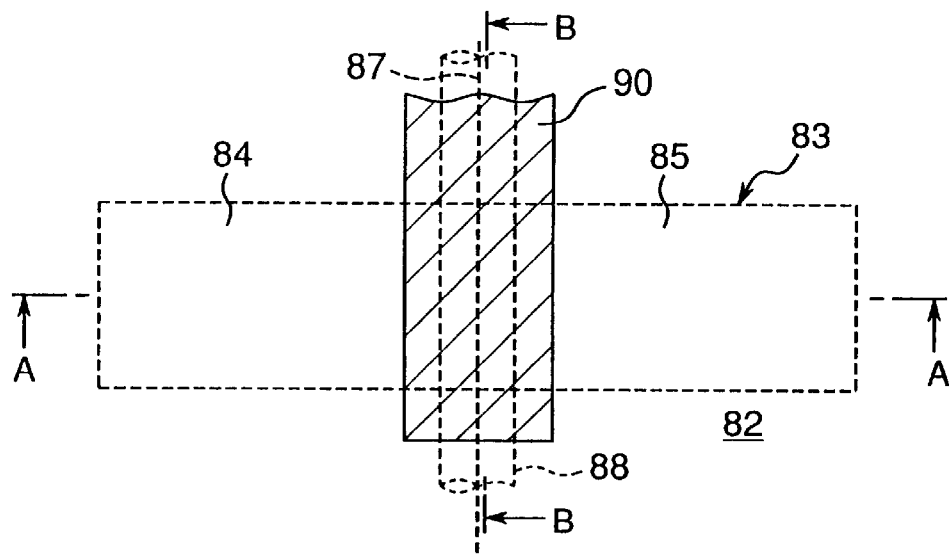
FIG. 6 is a plan view of a non-volatile memory using, as a floating gate, quantum dots or quantum fine wire formed according to the step forming procedure of FIG. 4 or FIG. 5.
Figure 7:
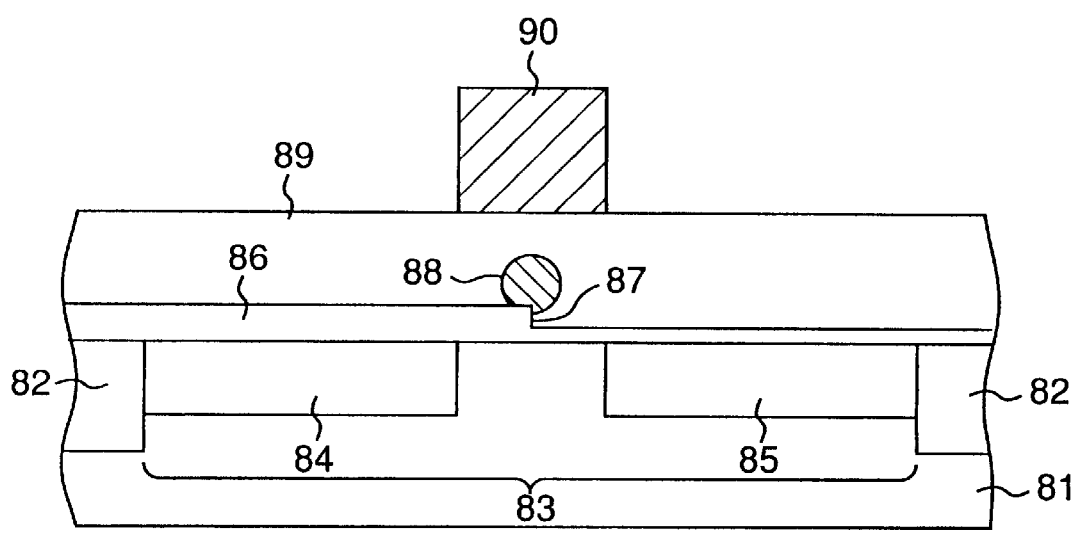
FIG. 7 is a sectional view taken along the line A—A in FIG. 6.

FIG. 6 is a plan view of a nonvolatile memory in the present embodiment. FIG. 7 is a section taken on the line A—A in FIG. 6. FIG. 8 is a section taken on the line B—B in FIG. 6. However, it is noted that FIG. 8A is a section in the case of quantum dot 88, and that FIG. 8B is a section in the case of quantum fine wire 91. In FIGS. 6 to 8, a source region 84 and a drain region 85 are formed in an active region 83 enclosed between isolation regions 82 on the Si substrate 81. Further, on the Si substrate 81 there is formed a tunnel insulating film 86. In a channel region on the tunnel insulating film 86 between the source region 84 and the drain region 85 there is formed a step 87 orthogonal to the direction extending between the source region 84 and the drain region 85, and quantum dots 88 (quantum fine particles 91) are formed along the step 87. The quantum dots 88 (quantum fine wire 91) function as a floating gate. Quantum dots 88 (quantum fine wire 91) may be of a semiconductor, such as Si, or may be metallic (such as Al). On the tunnel insulating film 86 there is formed a gate insulating film 84, and on the upper side of quantum dot 88 (quantum fine wire 91) on a control gate insulating film 89 there is formed a gate electrode 90.

This nonvolatile memory is formed in the following way. First, tunnel insulating film 86 is formed on Si substrate 81 for forming a 5 nm step 87 according to Embodiment 2 or 3. Quantum dots 88 or quantum fine wires 91 of nanometer size which will serve as a floating gate are formed at the position of the step 87.

Thereafter, a 10 nm thick control gate insulating film 89 is formed on the surface by aforesaid CVD process. Further, a gate electrode 90 is formed on the control gate insulating film 89. Thereafter, a source diffusing region and a source diffusing region are formed and made to function as source region 84 and drain region 85 respectively.

A nonvolatile memory having above described configuration is such that the floating gate comprises quantum dots 88 or quantum fine wires 91 so that charge accumulation at the floating gate can be reduced. This enables provision of a nonvolatile memory which involves less power consumption and has high density feature.

EMBODIMENT 5

This embodiment concerns the case where quantum fine wires formed by any of the forming methods described hereinbefore are applied to channels in a MOSFET (metal oxide field effect transistor).

FIG. 9A is a plan view of a MOSFET in the present embodiment. FIG. 9B and 9C are sections taken on the line B—B and C—C in FIG. 9(A), respectively. In FIG. 9, on an insulative substrate 101 there is provided a step 103 in a portion in which a channel region is formed, the step 103 extending in a direction in which the channel region extends. Quantum fine wires 104 of a semiconductor are formed along the step 103. On the insulating substrate 101 there extend a gate insulating film 102. Along the quantum fine wires 104 a source region 105, a channel region 106 and a drain region 107 are formed in sequential order in the longitudinal direction. Further, on the upper portion of channel region 106 on the gate insulating film 102 there is formed a gate electrode 108.

This MOSFET is formed in the following way. First, by using one of the Embodiments 1 to 3, a step 103 of 10 nm in height is formed on the surface of an insulative substrate 101 having an oxide film formed thereon, and quantum fine wires 104 of nanometer size are formed of a semiconductor at the position of the step 103.

Thereafter, a 30 nm-thick gate insulating film 102 is formed on the surface by aforesaid CVD process. Further, a gate electrode 108 is formed on the gate insulating film 102. Thereafter, a source diffusing region and a source diffusing region are formed on the gate electrode 108 at both sides thereof and made to function as source region 105 and drain region 107 respectively.

MOSFET, with above described configuration, is such that the channel region 106 comprises a quantum fine wire 104 so that the channel region 106 are quantized in two directions (Y and Z directions) orthogonal to the direction (X direction) in which the quantum fine wire 104 extends, whereby the channel region 106 exhibits one-dimensional conduction. This enables realization of a high-speed operable MOSFET. In the above connection, the term "quantize" means that discrete energy condition only is allowed with respect to two-directional electron movement.

In Embodiments 4 and 5, examples of application of quantum dots or quantum wire to a specific device. However, the embodiments are applicable to other devices. For example, according to Embodiments 1 to 3, conductive ultrafine wire can be formed without depending on any special fine processing technique. Therefore, above described quantum fine wire can be applied to high-density LSI wiring.

EMBODIMENT 6

The present embodiment concerns a light emitting device to which quantum dots formed according to the methods described in the foregoing Embodiments.

Figure 10:
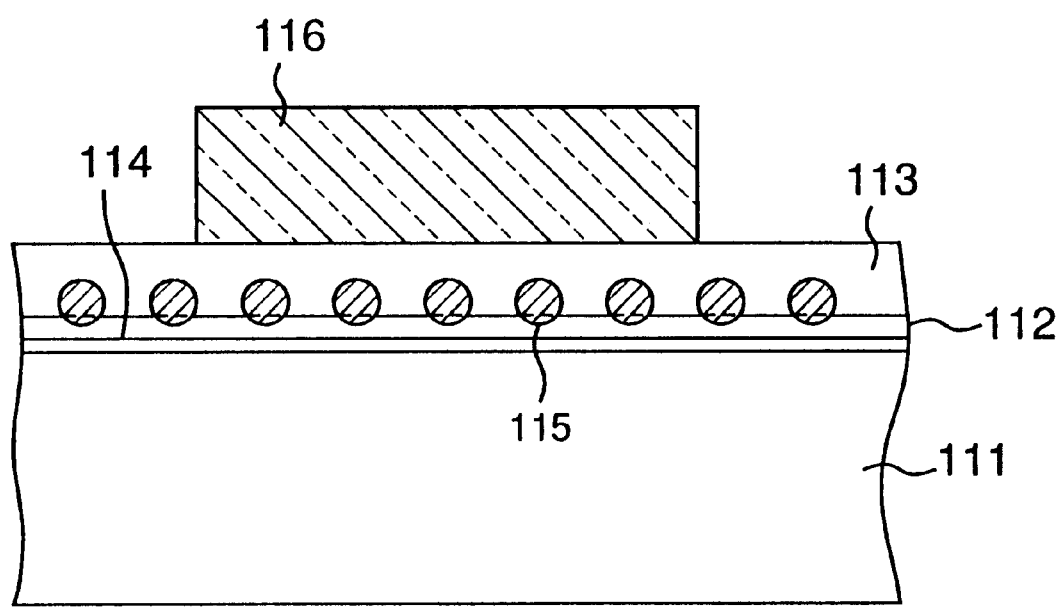
FIG. 10 is a sectional view of a light emitting device using quantum dots formed by using one of the step forming procedures illustrated in FIGS. 1, 2, 4 and 5.

FIG. 10 is a sectional view of a light-emitting device according to the present embodiment. In FIG. 10, insulating films 112, 113 are formed on an Si substrate 111. A step 114 is formed on the insulating film 112. Semiconductor quantum dots 115 are formed along the upper edge of the step 114. On the insulating film 113 there is formed a transparent electrode 116.

This light-emitting device is formed in the following way. First, a 5-nm thick step 114 is formed on the oxide film 112 of a Si substrate 111 by using one of the methods described in Embodiments 1 to 3. Quantum dots 115 of nanometer size are formed from a semiconductor at the position of the step 114. An insulating film 113 having a thickness of 30 nm is formed on the surface by CVD process, and then an ITO film is formed by sputtering or otherwise, the ITO film being made to serve as a transparent electrode 116.

The light-emitting device having above described configuration is such that electrons are injected into quantum dots 115 by applying a voltage between the transparent electrode 116 and the Si substrate 111 to make a tunnel current to flow. In that case, quantum dots 115 have been changed to dots of direct transition type band structure because they are ultrafine particles. As a result, electron transition occurs to enable light emission.

The light-emitting device is formed on the substrate 111. This makes it possible to mount an optical conversion device on an LSI substrate and to harmoniously combine an electric circuit and an optical communication circuit into an integral unity.

Device mounting and wiring in the foregoing Embodiments 4 to 6 can be carried out by a simple process comprising conventional photolithography, dry etching, LOCOS process, and CVD process, without necessity of any special fine processing technique and any other complex process. Positions for development of quantum dots and quantum fine wires and size (thickness) thereof in above mentioned device can be easily controlled, and high uniformity in size (thickness) and density, and high reproducibility can be easily achieved. Therefore, it is readily possible to mount the quantum elements and single-electron elements, together with conventional Si-system LSI, on a common substrate in harmonious relation.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An ultrafine particle and/or ultrafine wire forming method for forming metallic or semiconductor ultrafine particles and/or ultrafine wire having electric conductivity on an insulative substrate, which comprises:

preparing an insulative substrate formed with a step, and selectively forming the ultrafine particles and/or ultrafine wire along the upper edge of the step.

2. An ultrafine particle and/or ultrafine wire forming method as set forth in claim 1, wherein the step is not less than 1 nm in height.

3. An ultrafine particle and/or ultrafine wire forming method as set forth in claim 1, wherein preparation of the insulative substrate formed with the step is made by forming the step on a surface of the insulative substrate.

4. An ultrafine particle and/or ultrafine wire forming method as set forth in claim 1, wherein preparation of the insulative substrate formed with the step is carried out by forming the step on a surface of a semiconductor substrate, then forming an insulative film on the surface of the semiconductor substrate formed with the step.

5. An ultrafine particle and/or ultrafine wire forming method as set forth in claim 1, wherein preparation of the insulative substrate formed with the step is carried out by forming an insulative film on a surface of a semiconductor substrate, then patterning the insulative film to expose the surface of the semiconductor substrate, thus oxidizing the exposed surface of the semiconductor substrate.

6. An ultrafine particle and/or ultrafine wire forming method as set forth in claim 1, wherein preparation of the insulative substrate formed with the step is carried out by forming an insulative film on a surface of a semiconductor substrate, then patterning the insulative film to expose the surface of the semiconductor substrate, then laying an insulative film over the entire surface of the semiconductor substrate.

7. An ultrafine particle and/or ultrafine wire forming method as set forth in claim 1, wherein selective formation of the ultrafine particles or ultrafine wire along the upper edge of the step is carried out by introducing an insulative substrate formed with the step into a reaction chamber, evacuating the interior of the reaction chamber once to a high vacuum of not more than $10^{-6}$ Torr, then feeding material gas into the chamber to enable vapor phase growth of the ultrafine particles or ultrafine wire only along the upper edge of the step under a partial pressure of not more than $10^{-2}$ Torr of the material gas.

8. An ultrafine particle and/or ultrafine wire forming method as set forth in claim 7, wherein the ultrafine particles or the ultrafine wire is selectively formed by controlling at least one of the rate of gas flow, the time period of gas inflow, and the temperature of the substrate when the material gas is fed into the reaction chamber.

9. An ultrafine particle and/or ultrafine wire forming method as set forth in claim 7, wherein the material gas is monosilane ($SiH_4$), disilane ($Si_2H_6$), trisilane ($Si_3H_8$), dichlorosilane ($SiH_2Cl_2$), or tetrachlorosilane ($SiCl_4$), and forms ultrafine silicon particles or ultrafine silicon wire.

10. An ultrafine particle and/or ultrafine wire forming method as set forth in claim 7, wherein the material gas is germane ($GeH_4$), digermane ($Ge_2H_6$), or germanium fluoride ($GeF_4$), and forms ultrafine germanium particles or ultrafine germanium wire.

11. An ultrafine particle and/or ultrafine wire forming method as set forth in claim 7, wherein the material gas is a mixture gas of any one of monosilane ($SiH_4$), disilane ($Si_2H_6$), trisilane ($Si_3H_8$), dichlorosilane ($SiH_2Cl_2$), and tetrachlorosilane ($SiCl_4$), and any one of germane ($GeH_4$), digermane ($Ge_2H_6$), and germanium fluoride ($GeF_4$), and forms ultrafine particles or wire of germanium silicate.

12. An ultrafine particle and/or ultrafine wire forming method as set forth in claim 7, wherein the material gas is organic aluminum and forms ultrafine particles or wire of aluminum.

13. A semiconductor memory including a source region, a drain region, a channel region provided between the source region and the drain region, a gate region for controlling a channel current flowing in the channel region, a floating gate region provided between the channel region and the gate region, a first insulative film provided between the floating gate region and the gate region, and a second insulative film provided between the channel region and the floating gate region, wherein ultrafine particles and/or ultrafine wire formed according to the ultrafine particle and/or ultrafine wire forming method claimed in claim 1 is used as the floating gate.

14. A semiconductor memory including a source region, a drain region, a channel region provided between the source region and the drain region, a gate region for controlling a channel current flowing in the channel region, and an insulative film provided between the channel region and the gate region, wherein an ultrafine semiconductor wire formed according to the ultrafine particle and/or ultrafine wire forming method claimed in claim 1 is used as the channel region.

15. A semiconductor device comprising a structure such that ultrafine semiconductor particles formed according to the ultrafine particle and/or ultrafine wire forming method claimed in claim 1 are held between insulative films, with the insulative films held between electrodes, the semiconductor device being caused to emit light by a voltage being applied between the electrodes.

* * * * *